United States Patent
Ko

(10) Patent No.: US 12,488,997 B2
(45) Date of Patent: Dec. 2, 2025

(54) METHOD OF MANUFACTURING A SEMICONDUCTOR PACKAGE INCLUDING A PCB SUBSTRATE

(71) Applicant: Samsung Electronics Co., Ltd., Suwon-si (KR)

(72) Inventor: Bong Su Ko, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 939 days.

(21) Appl. No.: 17/568,427

(22) Filed: Jan. 4, 2022

(65) Prior Publication Data

US 2022/0392778 A1 Dec. 8, 2022

(30) Foreign Application Priority Data

Jun. 8, 2021 (KR) .......................... 10-2021-0074085

(51) Int. Cl.
*H05K 3/30* (2006.01)
*H01L 21/56* (2006.01)

(52) U.S. Cl.
CPC .................. *H01L 21/561* (2013.01)

(58) Field of Classification Search
CPC ..................... H01L 21/561; H01K 3/0017
See application file for complete search history.

(56) References Cited

U.S. PATENT DOCUMENTS

| | | | |
|---|---|---|---|
| 7,879,438 B2 | 2/2011 | Lin et al. | |
| 8,014,154 B2 | 9/2011 | Lee | |
| 8,410,375 B2 | 4/2013 | Matsushita et al. | |
| 9,202,769 B2 | 12/2015 | Lin et al. | |
| 10,741,419 B2 | 8/2020 | Karhade et al. | |
| 2017/0040293 A1* | 2/2017 | Kim | H01L 24/11 |
| 2017/0117252 A1* | 4/2017 | Baik | H01L 24/06 |
| 2019/0341356 A1 | 11/2019 | Chung et al. | |

FOREIGN PATENT DOCUMENTS

| | | |
|---|---|---|
| JP | 2013102143 A | 5/2013 |
| JP | 2017224672 A | 12/2017 |

* cited by examiner

*Primary Examiner* — Thomas T Pham
(74) *Attorney, Agent, or Firm* — Wolf, Greenfield & Sacks, P.C.

(57) ABSTRACT

A semiconductor package manufacturing method of the disclosure includes providing a PCB substrate that extends in a first direction and a second direction perpendicular to the first direction, forming a solder resist layer on the PCB substrate, partially removing the solder resist layer, thereby forming solder resist patterns, disposing semiconductor chips at opposite sides of each of the solder resist patterns, forming a mold layer covering a portion of the PCB substrate, covering the semiconductor chips, and covering at least a portion of each of the solder resist patterns, and cutting the PCB substrate and the mold layer, thereby forming semiconductor packages. In a third direction perpendicular to the first and second directions a height of the solder resist patterns may be greater than a height of the semiconductor chips while being smaller than a height of the mold layer.

19 Claims, 7 Drawing Sheets

METHOD OF MANUFACTURING A SEMICONDUCTOR PACKAGE INCLUDING A PCB SUBSTRATE

CROSS-REFERENCE TO THE RELATED APPLICATION

This application claims priority from Korean Patent Application No. 10-2021-0074085, filed on Jun. 8, 2021, in the Korean Intellectual Property Office, the disclosure of which is incorporated herein by reference in its entirety.

BACKGROUND

1. Field

The exemplary embodiments of the disclosure relate to a method of manufacturing a semiconductor package including a printed circuit board (PCB) substrate.

2. Description of the Related Art

In accordance with advances in electronic industries and user demand, miniaturization of a semiconductor package is required. To this end, the thickness of the semiconductor package is gradually reduced. The semiconductor package includes a printed circuit board (PCB), on which a semiconductor chip is mounted, and an encapsulator for encapsulating the semiconductor chip. A warpage phenomenon may occur in a process of manufacturing such a semiconductor package due to a thermal expansion coefficient difference between a PCB substrate and an encapsulator. The above-mentioned phenomenon may more easily occur as the thickness of the semiconductor package is further reduced.

SUMMARY

The exemplary embodiments of the disclosure provide a method of manufacturing a semiconductor package which is capable of preventing a warpage phenomenon.

A method of manufacturing a semiconductor package in accordance with an exemplary embodiment of the disclosure may include providing a printed circuit board (PCB) substrate including a longer side extending in a first direction, and a shorter side extending in a second direction perpendicularly intersecting the first direction, forming a solder resist layer on the PCB substrate, partially removing the solder resist layer through an exposure process and a development process, thereby forming solder resist patterns, the solder resist patterns being spaced apart from one another in the first direction while extending in the second direction to be parallel to the shorter side, disposing semiconductor chips at opposite sides of each of the solder resist patterns, forming a mold layer covering a portion of the PCB substrate, covering the semiconductor chips, and covering at least a portion of each of the solder resist patterns, and cutting the PCB substrate and the mold layer, thereby forming semiconductor packages. In a third direction perpendicular to the first and second directions, a height of the solder resist patterns may be greater than a height of the semiconductor chips while being smaller than a height of the mold layer.

A method of manufacturing a semiconductor package in accordance with an exemplary embodiment of the disclosure may include providing a printed circuit board (PCB) substrate that extends in a first direction and a second direction perpendicular to the first direction, forming an insulating layer on the PCB substrate, partially removing the insulating layer, thereby forming insulating patterns, disposing semiconductor chips at opposite sides of each of the insulating patterns, forming a mold layer covering a portion of the PCB substrate, covering the semiconductor chips, and covering at least a portion of each of the insulating patterns, and cutting the PCB substrate and the mold layer, thereby forming semiconductor packages. In a third direction perpendicular to the first and second directions, a height of the insulating patterns may be greater than a height of the semiconductor chips while being smaller than a height of the mold layer. In the first direction, a width of the insulating patterns may be smaller than a minimum distance between the semiconductor chips and the insulating patterns.

A method of manufacturing a semiconductor package in accordance with an exemplary embodiment of the disclosure may include providing a printed circuit board (PCB) substrate including a longer side extending in a first direction, and a shorter side extending in a second direction perpendicularly intersecting the first direction, forming a solder resist layer on the PCB substrate, partially removing the solder resist layer through an exposure process and a development process, thereby forming solder resist patterns, the solder resist patterns being spaced apart from one another in the first direction while extending in the second direction to be parallel to the shorter side, disposing semiconductor chips at opposite sides of each of the solder resist patterns, forming a mold layer covering a portion of the PCB substrate, covering the semiconductor chips, and covering at least a portion of each of the solder resist patterns, and cutting the PCB substrate and the mold layer, thereby forming semiconductor packages. In a third direction perpendicular to the first and second directions, a height of the solder resist patterns may be greater than a height of the semiconductor chips while being smaller than a height of the mold layer. In the first direction, a width of the solder resist patterns may be smaller than a minimum distance between the semiconductor chips and the solder resist patterns.

DETAILED DESCRIPTION OF EXEMPLARY EMBODIMENTS

FIGS. 1 to 11 are views explaining a method of manufacturing a semiconductor package in accordance with an exemplary embodiment of the disclosure. FIGS. 2, 4, 6, 8, and 10 are cross-sectional views taken along line I-I' in FIGS. 1, 3, 5, 7, and 9, respectively.

Figure 1:
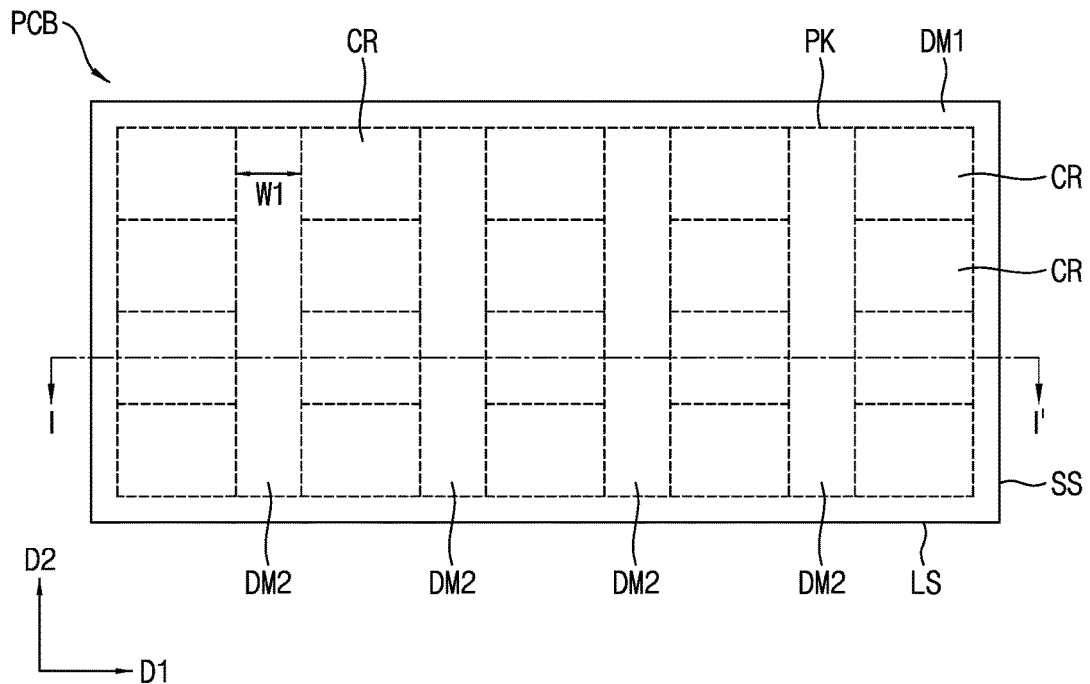
FIGS. 1 to 11 are views explaining a method of manufacturing a semiconductor package in accordance with an exemplary embodiment of the disclosure.
Figure 2:
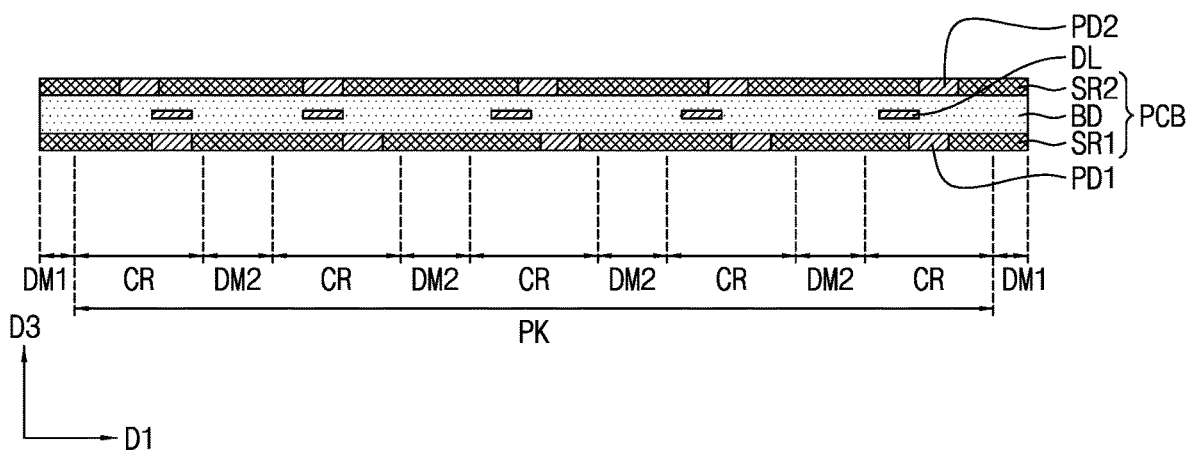

Referring to FIGS. 1 and 2, the method may include providing a printed circuit board (PCB) substrate. The PCB substrate may have the form of a quadrangular plate extending in a first direction D1 and a second direction D2. The first direction D1 may be a direction perpendicular to the second direction D2. For example, the PCB substrate may have a rectangular shape when viewed in a top view. The PCB substrate may include a longer side LS extending in the first direction D1, and a shorter side SS extending in the second direction D2. The length of the longer side LS may be greater than the length of the shorter side SS. For example, the length of the longer side LS may be two times or more the length of the shorter side SS.

Figure 9:
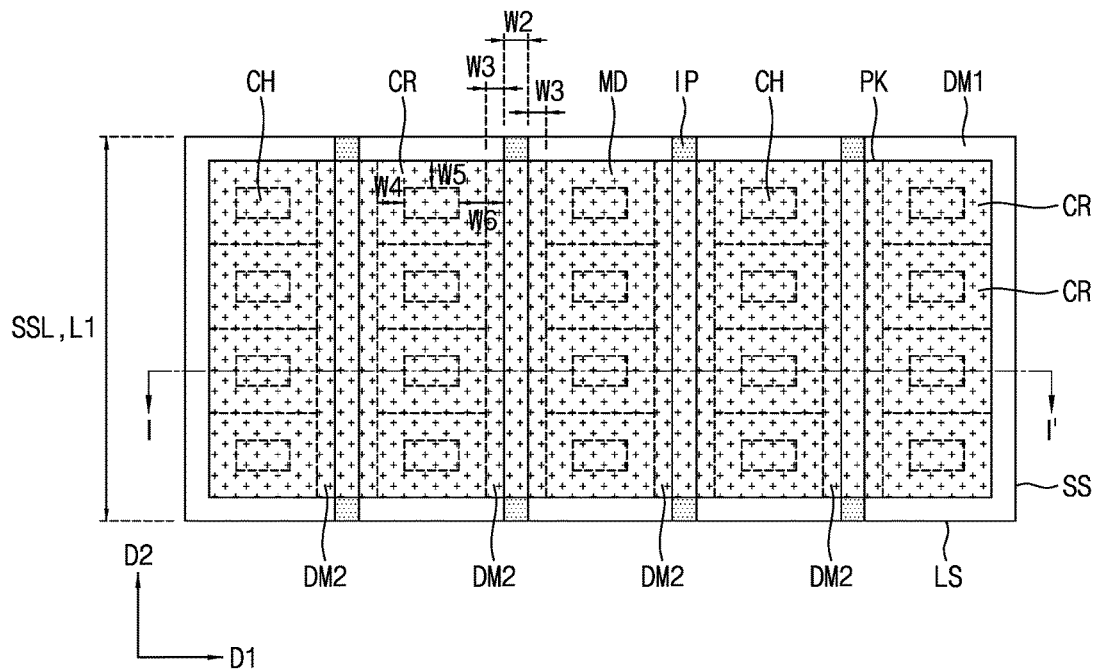
Figure 10:
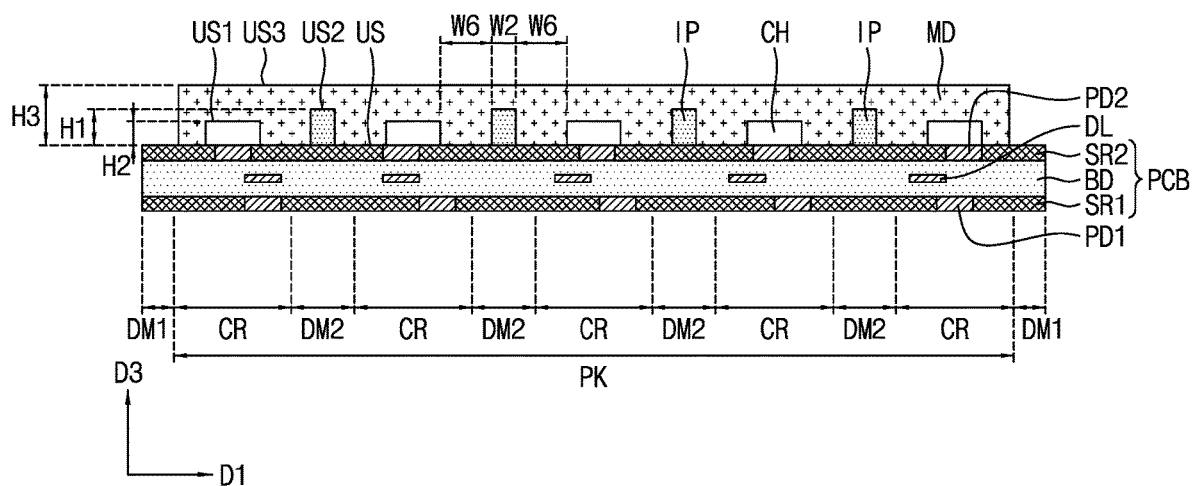

The PCB substrate may include a package region PK and an outer dummy region DM1. The outer dummy region DM1 may surround the package region PK. The outer dummy region DM1 may extend along an edge of the PCB substrate. The outer dummy region DM1 may include the longer side LS and the shorter side SS of the PCB substrate. When viewed in a top view, the outer dummy region DM1 may have a quadrangular ring shape. The package region PK may be a region disposed inside the outer dummy region DM1, except for the outer dummy region DM1. The package region PK may have a quadrangular shape when viewed in a top view. The package region PK may be a region where a mold layer MD (for example, as illustrated in FIGS. 9 and 10) will be disposed in a subsequent process. The outer dummy region DM1 may be a region where the mold layer MD (for example, as illustrated in FIGS. 9 and 10) will not be disposed in the subsequent process.

The package region PK may include chip regions CR and inner dummy regions DM2. The chip regions CR may be aligned in the second direction D2. The chip regions CR aligned in the second direction D2 may be disposed to be adjacent to one another. The chip regions CR aligned in the second direction D2 may form one row. The chip regions CR may be aligned in the first direction D1. The chip regions CR aligned in the first direction D1 may be disposed to be spaced apart from one another in the first direction D1. The inner dummy regions DM2 may be disposed among the chip regions CR spaced apart from one another in the first direction D1. The inner dummy regions DM2 may extend in the second direction D2 along the chip regions CR aligned in the second direction D2. The length of the inner dummy regions DM2 in the second direction D2 may correspond to the length of the row formed by the chip regions CR aligned in the second direction D2. A width W1 of the inner dummy region DM2 in the first direction D1 may correspond to a minimum distance between the chip regions CR spaced apart from each other in the first direction D1. For example, the width W1 of the inner dummy regions DM2 in the first direction D1 may be about 180 to 220 μm. Preferably, the width W1 of the inner dummy regions DM2 in the first direction D1 may be about 200 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The PCB substrate may include a base substrate BD, a lower insulating layer SR1, an upper insulating layer SR2, lower pads PD1, an upper pads PD2, and a wiring layer DL. The base substrate BD may be made of at least one material selected from phenol resin, epoxy resin, and polyimide. For example, the base substrate BD may include at least one material selected from flame retardant 4 (FR4), tetrafunctional epoxy, polyphenylene ether, epoxy/polyphenylene oxide, bismaleimide triazine (BT), Thermount, cyanate ester, polyimide, and liquid crystal polymer.

The lower insulating layer SR1 may be disposed on a bottom surface of the base substrate BD, and the upper insulating layer SR2 may be disposed on a top surface of the base substrate BD. The lower insulating layer SR1, the base substrate BD, and the upper insulating layer SR2 may be sequentially stacked in a third direction D3 perpendicular to the first direction D1 and the second direction D2. Each of the upper insulating layer SR2 and the lower insulating layer SR1 may be a solder resist layer made of a solder resist. The solder resist layer may be formed by, for example, coating a solder mask insulating ink on the top and bottom surfaces of the base substrate BD by a screen printing method or inkjet printing, and then curing the solder mask insulating ink using heat, ultraviolet (UV) light or infrared (IR) light. The solder resist layer may be formed by, for example, coating a photo-imageable solder resist on the entireties of the top and bottom surfaces of the base substrate BD by a screen printing method or a spray coating method or bonding a solder resist material to the top and bottom surfaces of the base substrate BD by a lamination method, removing an unnecessary portion of the photo-imageable solder resist or the solder resist material through exposure and development, and then curing the resultant photo-imageable solder resist or solder resist material using heat, UV light or IR light.

The lower pads PD1 may be disposed on the bottom surface of the base substrate BD, and the upper pads PD2 may be disposed on the top surface of the base substrate BD. The lower pads PD1 may be embedded in the lower insulating layer SR1 and a top surface and a bottom surface of the lower pads PD1 may be located at substantially the same level in the third direction as a top surface and a bottom surface of the lower insulating layer SR1, respectively. The lower insulating layer SR1 may cover a portion of the lower pads PD1. For example, the lower insulating layer SR1 may cover a side portion of the lower pads PD1. The upper pads PD2 may be embedded in the upper insulating layer SR2 and a top surface and a bottom surface of the upper pads PD2 may be located at substantially the same level in the third direction as a top surface and a bottom surface of the upper insulating layer SR2, respectively. The upper insulating layer SR2 may cover a portion of the upper pads PD2. For example, the upper insulating layer SR2 may cover a side portion of the upper pads PD2. The lower pads PD1 and the upper pads PD2 may include at least one of copper (Cu), nickel (Ni), stainless steel, or beryllium copper. The lower pads PD1 and the upper pads PD2 may be formed by, for example, laminating a copper (Cu) foil on the top and bottom surfaces of the base substrate BD, and then patterning the copper foil through partial removal thereof. In an embodiment, Ni/Au, etc. may be formed at surface portions of the upper pads PD2 and the lower pads PD1. Terms such as "same" and "equal" as used herein encompass identicality or near identicality including variations that may occur, for example, due to manufacturing processes. The term "substantially" may be used herein to emphasize this meaning, unless the context or other statements indicate otherwise.

The wiring layer DL may be disposed in the base substrate BD. The wiring layer DL may be electrically connected to the lower pads PD1 and the upper pads PD2 through a via (not shown) disposed in the base substrate BD. For example, the wiring layer DL and the via may include at least one of electrolytically-deposited (ED) copper, a rolled-annealed (RA) copper foil, a stainless steel foil, an aluminum foil, an ultra-thin copper foil, sputtered copper, copper alloys, nickel (Ni), stainless steel, or beryllium copper. The wiring layer DL and the via may include the same material as the upper pads PD2 and/or the lower pads PD1. The outer dummy regions DM1 and the inner dummy regions DM2 may be regions of the PCB substrate that do not include vias and/or interconnection lines that electrically connect the lower pads PD1 to the upper pads PD2. The outer dummy regions DM1 and the inner dummy regions DM2 may be areas to be discarded after the package is completed through subsequent processes.

Figure 3:
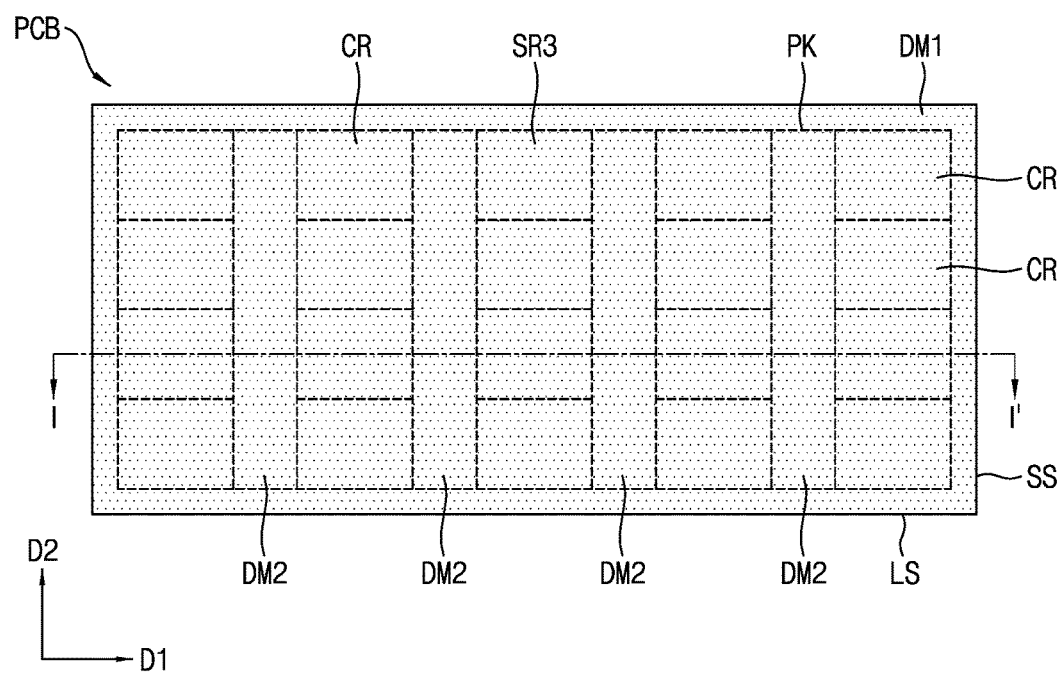
Figure 4:
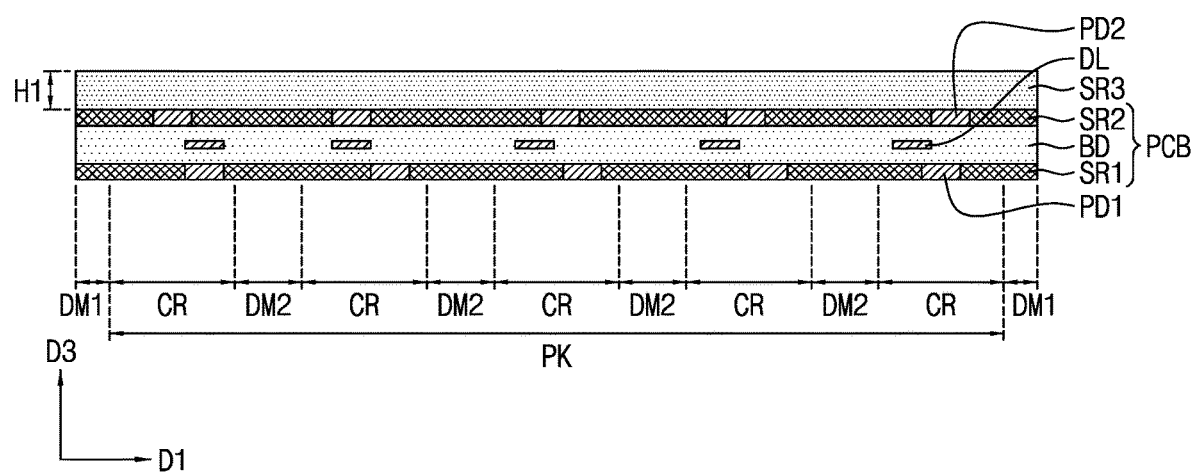

Referring to FIGS. 3 and 4, the method may include forming an insulating layer SR3 on the PCB substrate. The insulating layer SR3 may be formed at both the package region PK and the outer dummy region DM1 of the PCB substrate. The insulating layer SR3 may completely cover a top surface of the upper insulating layer SR2 of the PCB substrate. The insulating layer SR3 may cover the upper pads PD2 of the PCB substrate. For example, the insulating layer SR3 may be a photo-imageable solder resist layer. The insulating layer SR3 may be formed by coating a photo-imageable solder resist on the entirety of the top surface of the PCB substrate by a screen printing method or a spray coating method or bonding a solder resist material to the top surface of the PCB substrate by a lamination method. In an embodiment, the insulating layer SR3 may include the same material as the lower insulating layer SR1 and/or the upper insulating layer SR2 of the PCB substrate. The insulating layer SR3 may have a predetermined thickness in a third direction D3 perpendicular to the top surface of the PCB substrate. A height H1 of the insulating layer SR3 may be determined in accordance with heights of a semiconductor chip CH and a mold layer MD which will be formed in a subsequent process. For example, the height H1 of the insulating layer SR3 may be greater than the height of the semiconductor chip CH (for example, "H2" in FIG. 8) while being smaller than the height of the mold layer MD (for example, "H3" in FIG. 10). As used herein, the term "height" refers to a dimension of a component measured in the third direction D3 and the term "width" refers to a dimension of a component measured in one of the first direction D1 and the second direction D2.

Figure 5:
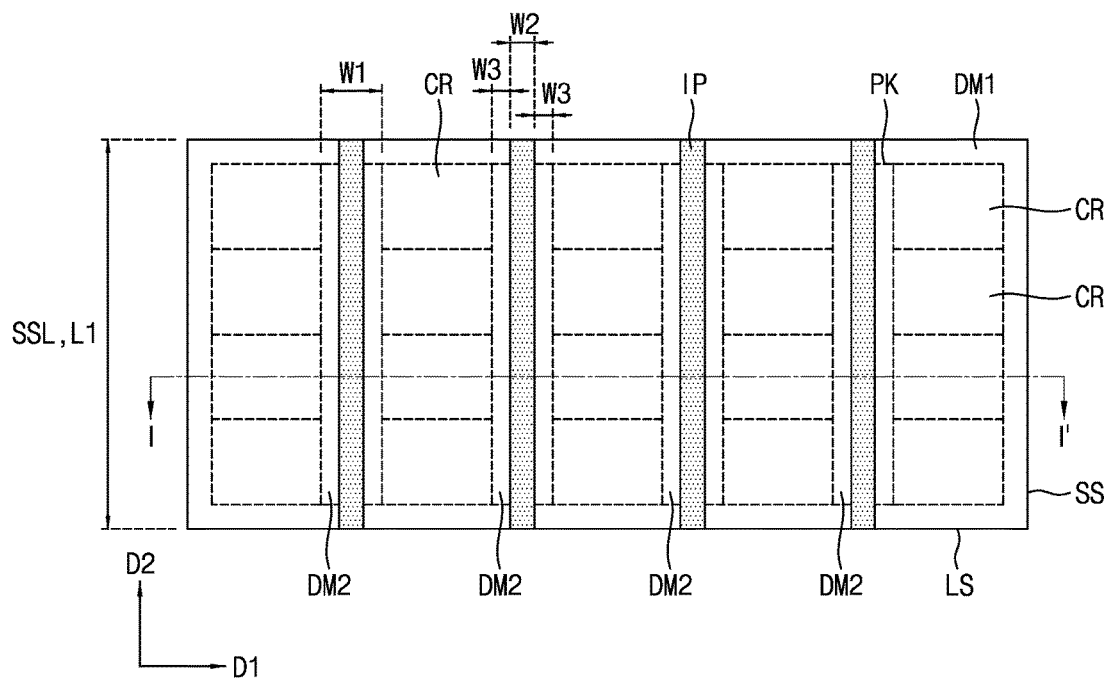
Figure 6:
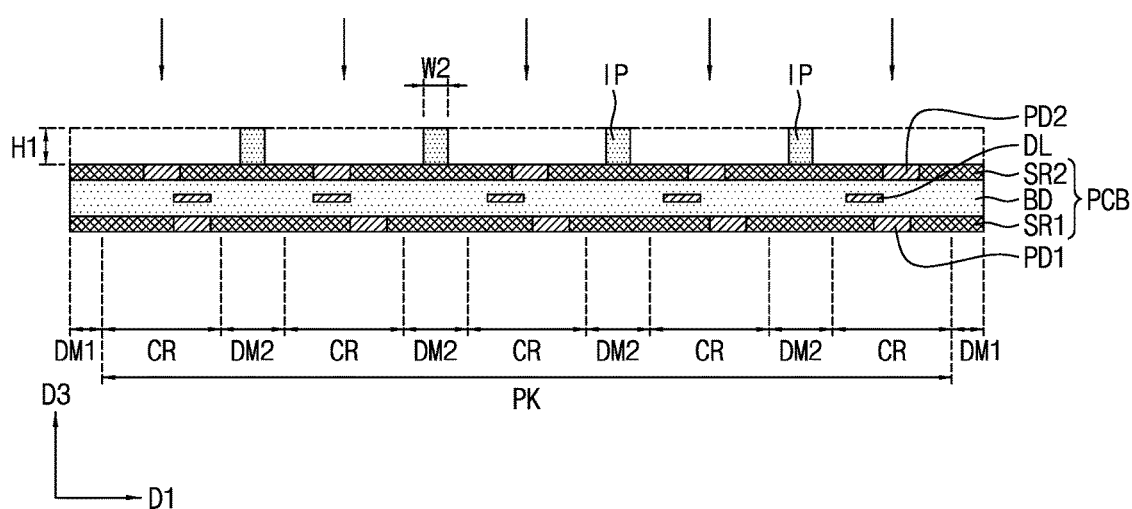

Referring to FIGS. 5 and 6, the method may include partially removing the insulating layer SR3, thereby forming insulating patterns IP. The insulating patterns IP may be solder resist patterns made of a solder resist. For example, when the insulating layer SR3 is a photo-imageable solder resist layer, the insulating layer SR3 may be partially removed through an exposure process and a development process and, as such, the insulating patterns IP, which are solder resist patterns, may be formed. In an embodiment, the insulating patterns IP, which are solder resist patterns, may be formed by coating a solder mask insulating ink on the top surface of the base substrate BD of the PCB substrate by a screen printing method or inkjet printing, and then curing the solder mask insulating ink using heat, UV light or IR light, in place of formation of the insulating patterns IP through partial removal of the insulating layer SR3. In this case, formation of the insulating layer SR3 (FIGS. 3 and 4), the exposure process and the development process may be omitted.

The insulating patterns IP may be formed to be disposed in the inner dummy regions DM2, respectively. The insulating patterns IP may be spaced apart from one another in the first direction D1. The insulting patterns IP may not be disposed in the chip regions CR. Each insulating pattern IP may extend in the second direction D2 and, as such, a portion of the insulating pattern IP may also be disposed in the outer dummy region DM1. The insulating patterns IP may extend in the second direction D2 and, as such, may be formed to be parallel to the shorter side SS of the PCB substrate. The insulating patterns IP may have a bar shape extending in the second direction D2. In an embodiment, a length L1 of the insulating patterns IP in the second direction D2 may correspond to a length SSL of the shorter side SS of the PCB substrate. A width W2 of the insulating patterns IP in the first direction D1 may be about 90 to 110 μm. Preferably, the width W2 of the insulating patterns IP in the first direction D1 may be about 100 μm. The width W2 of the insulating patterns IP in the first direction D1 may be about half of the width W1 of the inner dummy regions DM2 in the first direction D1. The insulating patterns IP may be disposed to be spaced apart from the chip regions CR. A minimum distance W3 between boundaries of the insulating patterns IP and the chip regions CR may be about 45 to 55 μm. Preferably, the minimum distance W3 between the boundaries of the insulating patterns IP and the chip regions CR may be about 50 μm.

Figure 7:
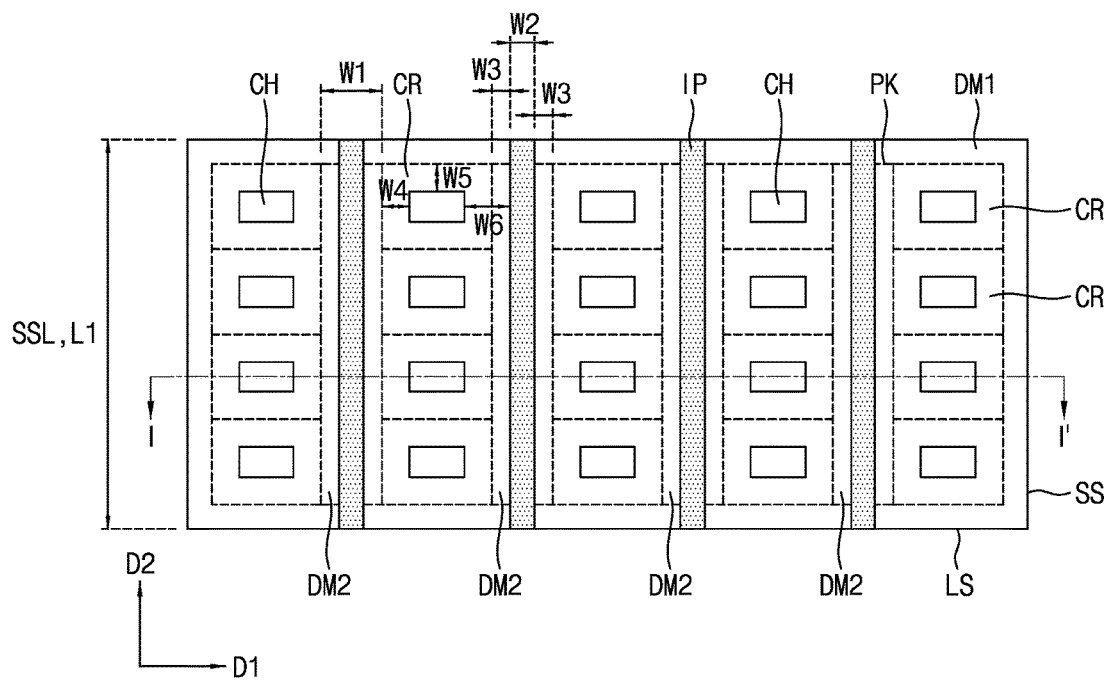
Figure 8:
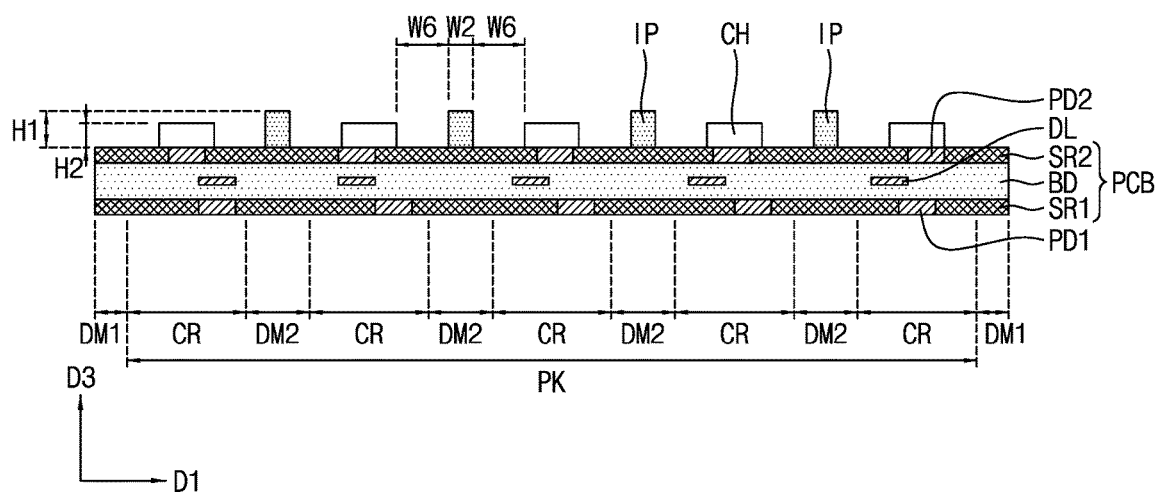

Referring to FIGS. 7 and 8, the method may include disposing semiconductor chips CH on the PCB substrate. The semiconductor chips CH may be disposed in the chip regions CR of the PCB substrate, respectively. The semiconductor chips CH may be disposed at opposite sides of each of the insulating patterns IP. The semiconductor chips CH and the insulating patterns IP may be disposed to alternate in the second direction D2. The semiconductor chips CH may be disposed at central portions of the chip regions CR, respectively. The area of each of top and bottom surfaces of the semiconductor chips CH may be smaller than the area of the chip region CR. For example, when the semiconductor chips CH are respectively disposed in the chip regions CR, a portion of the chip region CR is uncovered by the semiconductor chip CH. Minimum distances W4 and W5 between the semiconductor chips CH and boundaries of the chip regions CR may be about 90 to 110 μm. Preferably, the minimum distances W4 and W5 between the semiconductor chips CH and the boundaries of the chip regions CR may be about 100 μm. Minimum distances W5 may extend in the second direction and minimum distances W4 may extend in the first direction D1. The minimum distances W4 between the semiconductor chips CH and the boundaries of the chip regions CR may correspond to minimum distances between the semiconductor chips CH and boundaries of the inner dummy region DM2 adjacent thereto. The minimum distances W5 between the semiconductor chips CH and the boundaries of the chip regions CR may correspond to minimum distances between the semiconductor chips CH disposed adjacent to the outer dummy region DM1 and the outer dummy region DM1 adjacent thereto. A minimum distance W6 between the semiconductor chips CH and the insulating patterns IP adjacent thereto may be about 135 to 165 μm. Preferably, the minimum distance W6 between the semiconductor chips CH and the insulating patterns IP adjacent thereto may be about 150 μm. The width W2 of the insulating patterns IP in the first direction D1 may be smaller than the minimum distance W6 between the semiconductor chips CH and the insulating patterns IP adjacent thereto. A height H2 of the semiconductor chips CH may be smaller than the height H1 of the insulating patterns IP.

Referring to FIGS. 9 and 10, the method may include forming a mold layer MD. The mold layer MD may be formed in the package region PK of the PCB substrate. The mold layer MD may not be formed in the outer dummy region DM1 of the PCB substrate. The mold layer MD may be formed to cover a portion of the PCB substrate, the semiconductor chips CH, and at least a portion of each insulating pattern IP. The mold layer MD may not cover a portion, formed in the outer dummy region DM1, of each insulating pattern IP. For example, the mold layer MD may be an epoxy molding compound (EMC). A height H3 of the mold layer MD may be greater than the height H1 of the insulating patterns IP. The height H1 of the insulating patterns IP may be greater than 0.5 times the height H3 of the mold layer MD. The level of a top surface US2 of the insulating patterns IP may be higher than the level of a top surface US1 of the semiconductor chips CH while being lower than the level of a top surface US3 of the molding layer MD with reference to a top surface US of the PCB substrate in the third direction D3.

Figure 11:
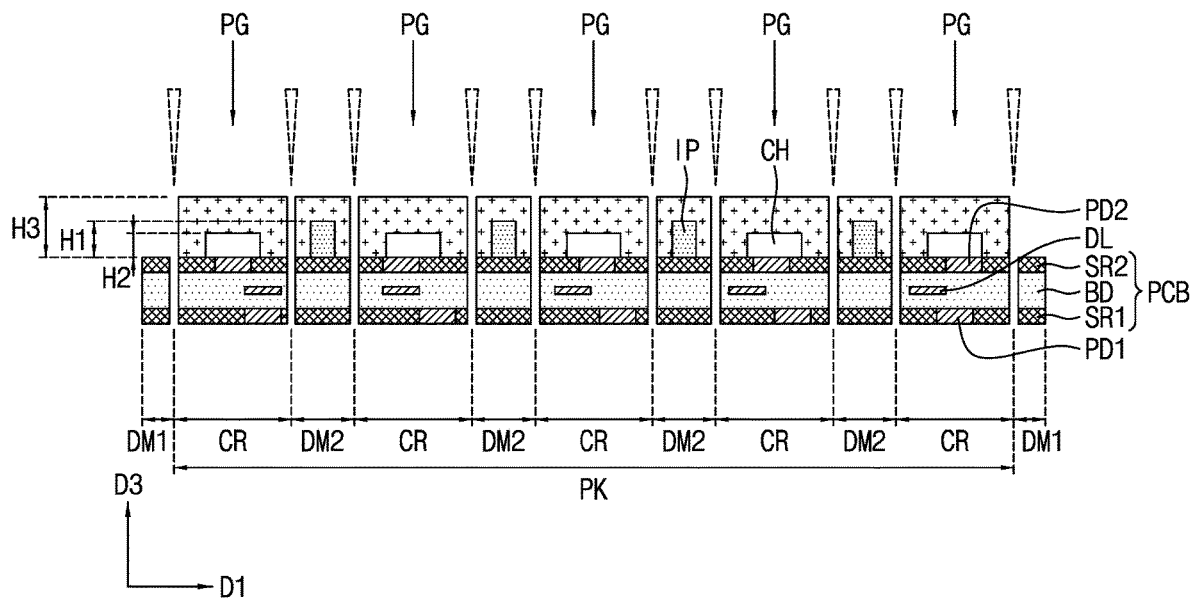

Referring to FIG. 11, the method may include cutting the PCB substrate and the mold layer MD, thereby forming semiconductor packages PG. The semiconductor packages PG may include the PCB substrate cut along boundaries of the chip regions CR, the semiconductor chip CH disposed on the PCB substrate, and the mold layer MD cut along the boundaries of the chip regions CR. The outer dummy region DM1, the inner dummy region DM2 and the insulating patterns IP of the PCB substrate may be removed without being included in the semiconductor package PG.

Figure 12:
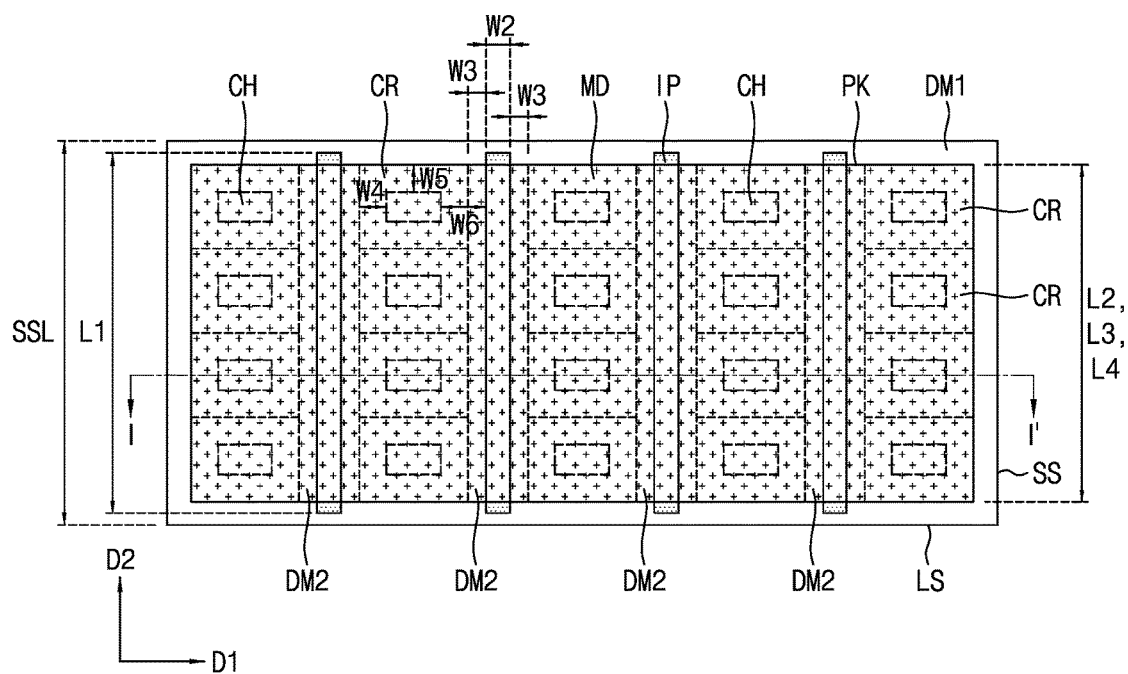
FIG. 12 is a view explaining a semiconductor package manufacturing method according to an exemplary embodiment of the disclosure.

FIG. 12 is a view explaining a semiconductor package manufacturing method according to an exemplary embodiment of the disclosure.

FIG. 12 shows a state in which insulating patterns IP, semiconductor chips CH, and a mold layer MD are formed on a PCB substrate. Referring to FIG. 12, a length L1 of the insulating patterns IP in a second direction D2 may be smaller than a length SSL of a shorter side SS of the PCB substrate. The length L1 of the insulating patterns IP in the second direction D2 may be greater than a length L2 of a package region PK of the PCB substrate in the second direction D2. The length L1 of the insulating patterns IP in the second direction D2 may be greater than a length L3 of an inner dummy region DM2 of the package region PK in the second direction D2. The length L1 of the insulating patterns IP in the second direction D2 may be greater than a length L4 of the mold layer MD in the second direction D2. The insulating patterns IP may extend in the second direction D2 and, as such, may extend from the inner dummy region DM2 to an outer dummy region DM1. Portions of the insulating patterns IP may be formed in the outer dummy region DM1. For example, the mold layer MD may cover portions of the insulating patterns IP formed in the inner dummy region DM2, and the mold layer MD may not cover portions of the insulating patterns IP formed in the outer dummy region DM1.

Figure 13:
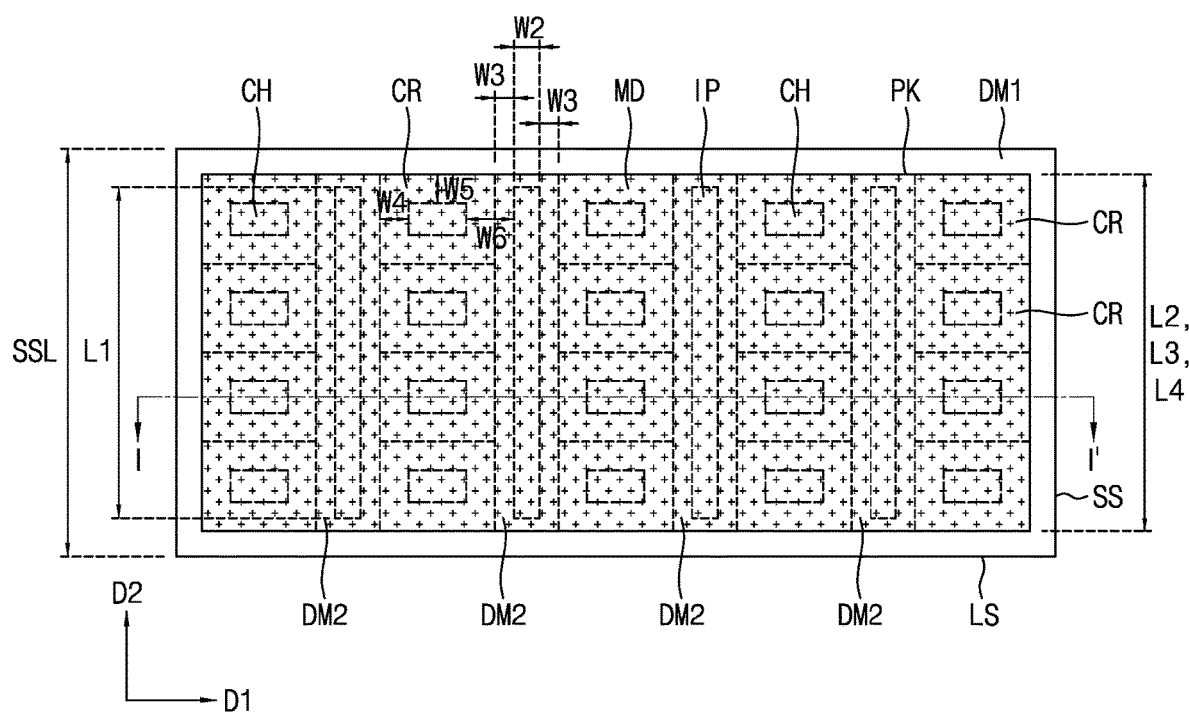
FIG. 13 is a view explaining a semiconductor package manufacturing method according to an exemplary embodiment of the disclosure.

FIG. 13 is a view explaining a semiconductor package manufacturing method according to an exemplary embodiment of the disclosure.

FIG. 13 shows a state in which insulating patterns IP, semiconductor chips CH, and a mold layer MD are formed on a PCB substrate. Referring to FIG. 13, a length L1 of the insulating patterns IP in a second direction D2 may be smaller than a length SSL of a shorter side SS of the PCB substrate. The length L1 of the insulating patterns IP in the second direction D2 may be smaller than a length L2 of a package region PK of the PCB substrate in the second direction D2. The length L1 of the insulating patterns IP in the second direction D2 may be smaller than a length L3 of an inner dummy region DM2 of the package region PK in the second direction D2. The length L1 of the insulating patterns IP in the second direction D2 may be smaller than a length L4 of the mold layer MD in the second direction D2. The insulating patterns IP may be completely covered by the mold layer MD. For example, side surfaces and top surfaces of the insulating patterns IP may be completely covered by the mold layer MD.

In accordance with the exemplary embodiments of the disclosure, a semiconductor package manufacturing method capable of preventing a warpage phenomenon by reducing the volume of a mold layer formed on a PCB substrate through provision of insulating patterns on the PCB substrate may be provided.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A method of manufacturing a semiconductor package, comprising:
    providing a printed circuit board (PCB) substrate comprising a longer side extending in a first direction, and a shorter side extending in a second direction perpendicularly intersecting the first direction;
    forming a solder resist layer on the PCB substrate;
    partially removing the solder resist layer through an exposure process and a development process, thereby forming solder resist patterns, the solder resist patterns being spaced apart from one another in the first direction while extending in the second direction to be parallel to the shorter side;
    disposing semiconductor chips at opposite sides of each of the solder resist patterns;
    forming a mold layer covering a portion of the PCB substrate, covering the semiconductor chips, and covering at least a portion of each of the solder resist patterns; and
    cutting the PCB substrate and the mold layer at locations between each of the solder resist patterns and adjacently located semiconductor chips, thereby forming semiconductor packages,
    wherein, in a third direction perpendicular to the first and second directions, a height of the solder resist patterns is greater than a height of the semiconductor chips while being smaller than a height of the mold layer.

2. The method according to claim 1, wherein a width of the solder resist patterns in the first direction is about 90 to 110 μm.

3. The method according to claim 1, wherein a minimum distance between the solder resist patterns and the semiconductor chips is about 135 to 165 μm.

4. The method according to claim 1, wherein the height of the solder resist patterns is greater than 0.5 times the height of the mold layer.

5. The method according to claim 1, wherein the solder resist patterns have a bar shape extending in the second direction.

6. The method according to claim 1, wherein a length of the solder resist patterns in the second direction is equal to or less than a length of the shorter side of the PCB substrate.

7. The method according to claim 1, wherein:
    the PCB substrate comprises a package region, and an outer dummy region surrounding the package region;
    the package region comprises chip regions, in which the semiconductor chips are disposed, and inner dummy regions disposed among the chip regions; and
    the solder resist patterns are formed in the inner dummy regions.

8. The method according to claim 7, wherein a minimum distance between boundaries of the chip regions and the solder resist patterns is about 45 to 55 µm.

9. The method according to claim 7, wherein a minimum distance between the semiconductor chips and boundaries of the chip regions is about 90 to 110 µm.

10. The method according to claim 7, wherein the mold layer is formed in the package region without being formed in the outer dummy region.

11. The method according to claim 10, wherein:
the solder resist patterns extend in the second direction such that a portion of each of the solder resist patterns is formed in the outer dummy region; and
the portion of each of the solder resist patterns formed in the outer dummy region is not covered by the mold layer.

12. The method according to claim 1, wherein the mold layer comprises an epoxy molding compound (EMC).

13. The method according to claim 1, wherein:
the PCB substrate comprises
a base substrate,
an upper insulating layer on a top surface of the base substrate, and
a lower insulating layer on a bottom surface of the base substrate; and
each of the upper insulating layer and the lower insulating layer is a solder resist layer.

14. The method according to claim 13, wherein the solder resist patterns comprise the same material as the upper insulating layer or the lower insulating layer.

15. A method of manufacturing a semiconductor package, comprising:
providing a printed circuit board (PCB) substrate that extends in a first direction and a second direction perpendicular to the first direction;
forming an insulating layer on the PCB substrate;
partially removing the insulating layer, thereby forming insulating patterns and exposing portions of the PCB;
disposing semiconductor chips at opposite sides of each of the insulating patterns, wherein each of the semiconductor chips is disposed on one of the exposed portions of the PCB;
forming a mold layer covering a portion of the PCB substrate, covering the semiconductor chips, and covering at least a portion of each of the insulating patterns; and
cutting the PCB substrate and the mold layer, thereby forming semiconductor packages,
wherein, in a third direction perpendicular to the first and second directions, a height of the insulating patterns is greater than a height of the semiconductor chips while being smaller than a height of the mold layer,
wherein, in the first direction, a width of the insulating patterns is smaller than a minimum distance between the semiconductor chips and the insulating patterns.

16. The method according to claim 15, wherein the partially removing the insulating layer comprises an exposure process and a development process.

17. The method according to claim 15, wherein:
the PCB substrate comprises
a package region, and an outer dummy region surrounding the package region;
the package region comprises chip regions, in which the semiconductor chips are disposed, and inner dummy regions disposed among the chip regions; and
the insulating patterns are formed in the inner dummy regions.

18. The method according to claim 17, wherein a minimum distance between boundaries of the chip regions and the insulating patterns is about 45 to 55 µm.

19. The method according to claim 17, wherein a minimum distance between the semiconductor chips and boundaries of the chip regions is about 90 to 110 µm.

* * * * *